US012813212B2

(12) United States Patent
Koiwa

(10) Patent No.: US 12,813,212 B2

(45) Date of Patent: Nov. 24, 2026

(54) SUBSTRATE SUPPORT AND SUBSTRATE PROCESSING APPARATUS

(71) Applicant: Tokyo Electron Limited, Tokyo (JP)

(72) Inventor: Shingo Koiwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 869 days.

(21) Appl. No.: 17/988,513

(22) Filed: Nov. 16, 2022

(65) Prior Publication Data

US 2023/0163012 A1 May 25, 2023

(30) Foreign Application Priority Data

Nov. 19, 2021 (JP) ................................. 2021-188686

(51) Int. Cl.

*H10P 72/72* (2026.01)
*H10P 72/00* (2026.01)
*H10P 72/76* (2026.01)

(52) U.S. Cl.

CPC ........ *H10P 72/722* (2026.01); *H10P 72/0432* (2026.01); *H10P 72/72* (2026.01); *H10P 72/7624* (2026.01)

(58) Field of Classification Search

CPC .... H10P 72/722; H10P 72/0432; H10P 72/72; H10P 72/7624; H01L 21/67109; H01L 21/67248; H01L 21/683; H01L 21/6831; H01L 21/6833; H01L 21/68757; H01L 21/68785; H01L 21/67103; H01J 37/32724

See application file for complete search history.

(56) References Cited

U.S. PATENT DOCUMENTS

2015/0027637 A1* 1/2015 Haga ................. H01J 37/32091 156/345.28
2019/0244795 A1* 8/2019 Tandou ............. H01J 37/32724
2023/0163012 A1* 5/2023 Koiwa ................ H01L 21/6831 279/128

FOREIGN PATENT DOCUMENTS

| | | | | | |
|---|---|---|---|---|---|
| CN | 106463402 | A | * | 2/2017 | .......... H10P 72/0602 |
| CN | 108550547 | A | * | 9/2018 | ............ H10P 72/722 |
| CN | 112582330 | A | * | 3/2021 | ......... H01L 21/6831 |
| JP | 2005210039 | A | * | 8/2005 | |
| JP | 2013-172013 | A | | 9/2013 | |
| JP | 2017-126640 | A | | 7/2017 | |
| JP | 2017-126641 | A | | 7/2017 | |
| JP | 2022114439 | A | * | 8/2022 | |
| KR | 10-20140140112 | A | | 12/2014 | |
| TW | 201110401 | A | * | 3/2011 | ........... H10F 19/804 |
| TW | 452916 | B | * | 9/2011 | ......... H01L 21/6831 |

(Continued)

*Primary Examiner* — Jeffrie R Lund

(74) *Attorney, Agent, or Firm* — XSENSUS LLP

(57) ABSTRACT

A substrate support includes: a conductive base having a flow path through which a fluid for temperature control flows; an electrostatic chuck disposed above the base and having a support surface of the substrate on an upper surface of the electrostatic chuck; and a metal bonding portion configured to mutually bond the base and the electrostatic chuck. The base includes: a main body member having at least one recess configured to define at least a part of a side surface of the flow path and a bottom surface of the flow path; and a heat transfer member configured to define a ceiling surface of the flow path and perform heat transfer between the fluid for temperature control and the electrostatic chuck.

10 Claims, 8 Drawing Sheets

(56) References Cited

FOREIGN PATENT DOCUMENTS

| | | | |
|---|---|---|---|
| TW | 201423827 | A | 6/2014 |
| WO | 2014/141974 | A1 | 9/2014 |

* cited by examiner

FIG. 4

| BRAZING MATERIAL \ RF ELECTRODE MATERIAL | | | LINEAR EXPANSION COEFFICIENT DIFFERENCE (/°C) | | |
|---|---|---|---|---|---|
| | | | Al+Si COMPOSITE MATERIAL<br>Al+SiC COMPOSITE MATERIAL | Ti ALLOY | — |
| | | | 1.E−06 | 2.E−06 | 3.E−06 |
| BONDING TEMPERATURE [°C] | — | 200 | | | |
| | — | 300 | | | |
| | — | 400 | | | |
| | Al BRAZING MATERIAL | 500 | | | |
| | Al BRAZING MATERIAL<br>Ag BRAZING MATERIAL | 600 | | | |
| | Ag BRAZING MATERIAL | 700 | | | |

: DAMAGE SUPPRESSION POSSIBLE (blank cells)
: DAMAGE GENERATION CONCERN (shaded cells: 3.E−06 at 300–700; 2.E−06 at 500–700)

SUBSTRATE SUPPORT AND SUBSTRATE PROCESSING APPARATUS

CROSS-REFERENCE TO RELATED APPLICATIONS

This application claims priority to Japanese Patent Application No. 2021-188686, filed on Nov. 19, 2021, the entire contents of which are incorporated herein by reference.

TECHNICAL FIELD

The present disclosure relates to a substrate support and a substrate processing apparatus.

BACKGROUND

Patent Document 1 discloses a substrate processing apparatus that includes a base where a flow path for coolant extending to an inlet and an outlet is provided in the inside, and a stage provided on an upper surface of the base through an adhesive and having an electrostatic chuck provided with a heater in the inside or on a lower surface thereof.

PRIOR ART DOCUMENTS

Patent Documents

Patent Document 1: JP-A-2013-172013

SUMMARY

The technique according to the present disclosure provides a substrate support in which a temperature of a substrate can be appropriately adjusted by a heat transfer medium flowing through a flow path formed in a base.

An aspect of the present disclosure is a substrate support including a conductive base having a flow path through which a fluid for temperature control flows; an electrostatic chuck disposed above the base and having a support surface of the substrate on an upper surface of the electrostatic chuck; and a metal bonding portion configured to mutually bond the base and the electrostatic chuck. The base includes: a main body member having at least one recess configured to define at least a part of a side surface of the flow path and a bottom surface of the flow path; and a heat transfer member configured to define a ceiling surface of the flow path and perform heat transfer between the fluid for temperature control and the electrostatic chuck.

According to the present disclosure, it is possible to provide the substrate support in which the substrate temperature can be appropriately adjusted by the heat transfer fluid flowing through the flow path formed in the base.

BRIEF DESCRIPTION OF THE DRAWINGS

FIG. 4 is a table illustrating a combination of constituent members of the substrate support according to an embodiment of the present disclosure.

DETAILED DESCRIPTION

Figure 1:
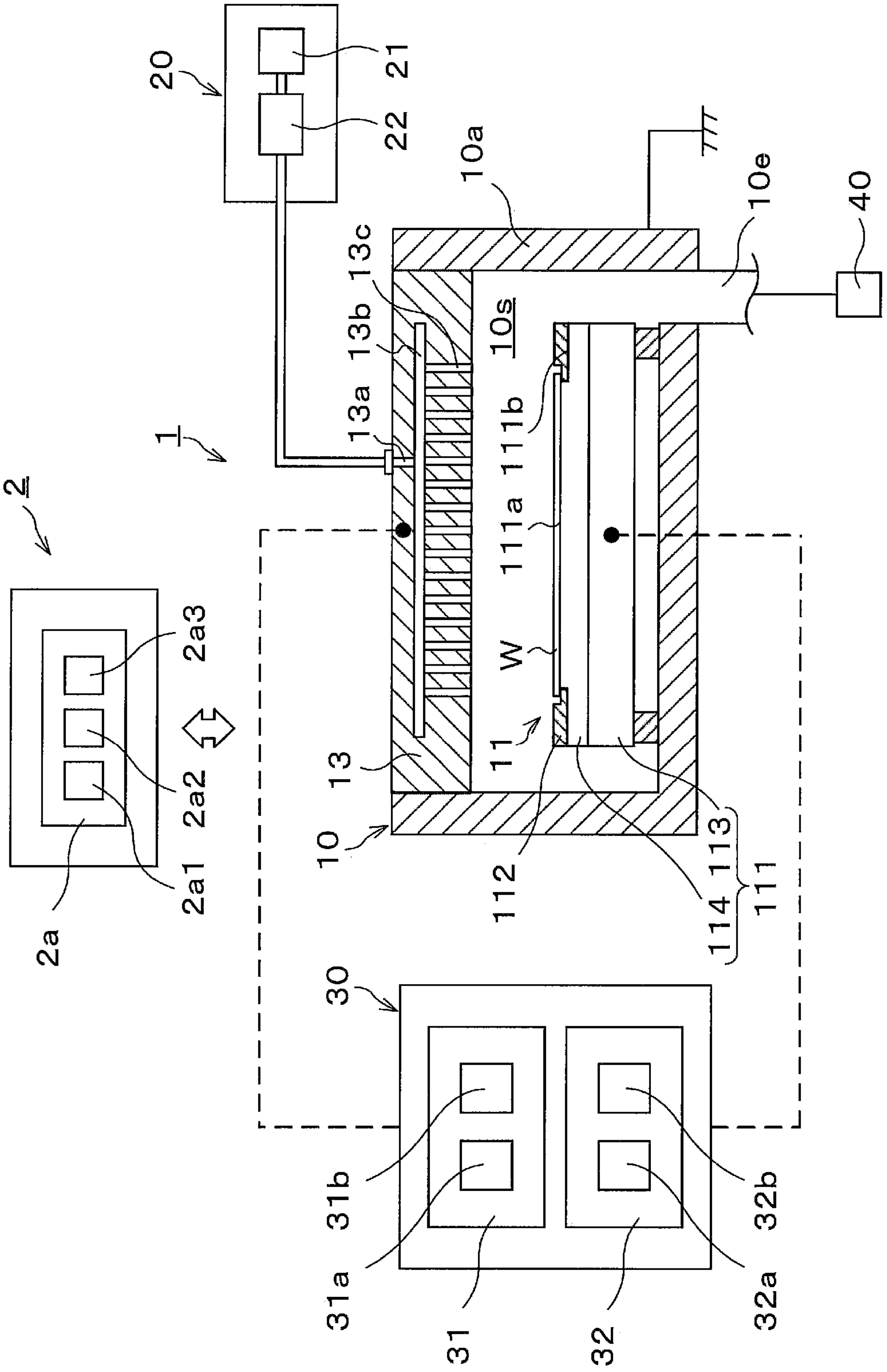
FIG. 1 is a vertical sectional view illustrating a configuration example of a plasma processing system according to an embodiment of the present disclosure.

In the manufacturing process of a semiconductor device, an etching target layer (for example, a silicon-containing film) formed by stacking on a surface of a semiconductor substrate (hereinafter, simply referred to as a "substrate") is subjected to an etching process using a mask layer (for example, a resist film) in which a pattern is formed in advance as a mask. This etching process is generally performed in a plasma processing apparatus that includes a substrate support that adsorbs and holds a substrate by using an electrostatic force.

Patent Document 1 discloses a substrate processing apparatus including such a substrate support (stage). The substrate support described in Patent Document 1 is formed by bonding via an adhesive a base in which a flow path for a coolant is formed and an electrostatic chuck provided with a heater for heating the substrate.

In a recent plasma processing apparatus, as the above-described etching process, a 3D NAND High Aspect Ratio Contact (HARC) process (hereinafter referred to as simply "HARC process") of forming a hole by deep etching in the substrate formed by stacking may be performed. However, in the HARC process, it is required to appropriately form the hole by deep etching by bringing radio frequency (RF) power to high power, while there is a concern that the hole cannot be appropriately formed due to a high temperature of the substrate due to the high power of the RF power. For example, the hole formed on the substrate may be closed due to the high temperature of the substrate, and thus, there is a concern that the hole cannot be formed appropriately by deep etching.

Here, as a countermeasure method for appropriately performing the HARC process by suppressing the closing of the hole, for example, maintaining the substrate of a processing target at a desired temperature or lower, that is, appropriately performing the cooling of the substrate, is considered.

As also disclosed in Patent Document 1, cooling of the substrate supported by the substrate support is generally performed by a coolant that flows through a flow path formed inside the base of the substrate support. However, in a case where the base in which the flow path is formed and the electrostatic chuck that supports the substrate are bonded to each other through the adhesive as in the substrate support (stage) disclosed in Patent Document 1, cooling of the substrate may not be appropriately performed. Specifically, as the adhesive for bonding the base and the electrostatic chuck, an adhesive made of a resin material with high thermal resistance (hereinafter referred to as a "resin adhesive") is often used, and heat transfer from the coolant to the substrate is hindered by the resin adhesive, so that there is a concern that the substrate cannot be appropriately cooled.

Therefore, the present inventors have intensively investigated, and have discovered the following possibility: in a case where the base in which the flow path is formed and the electrostatic chuck that supports the substrate is bonded together using a brazing metal with low thermal resistance instead of the above-described resin adhesive, heat conduction can be promoted, thereby appropriately cooling the substrate. However, in contrast, the base and the electrostatic chuck each generally comprise members having a different linear expansion coefficient; thus, there is a concern that damage occurs on these base and the electrostatic chuck due to thermal stress to be generated during the metal bonding.

The present disclosure has been made in view of the above-described circumstances, and provides a substrate support capable of appropriately cooling the substrate by a heat transfer fluid flowing through the flow path formed in the base. Hereinafter, a plasma processing system as the substrate processing apparatus according to embodiments of the present disclosure will be described with reference to the drawings. The same reference numerals will be given to elements having substantially the same functional configurations throughout the specification and the drawings, and redundant description thereof will be omitted.

<Plasma Processing Apparatus>

First, a plasma processing system according to an embodiment of the present disclosure will be described. FIG. 1 is a vertical sectional view illustrating a configuration of the plasma processing system according to an embodiment of the present disclosure.

The plasma processing system includes a capacitively-coupled plasma processing apparatus 1 and a controller 2. A plasma processing apparatus 1 includes a plasma processing chamber 10, a gas supply 20, a power source 30, and an exhaust system 40. Further, the plasma processing apparatus 1 includes a substrate support 11 and a gas introduction unit. The substrate support 11 is disposed inside the plasma processing chamber 10. The gas introduction unit is configured to introduce at least one processing gas into the plasma processing chamber 10. The gas introduction unit includes a shower head 13. The shower head 13 is disposed above the substrate support 11. In one embodiment, the shower head 13 constitutes at least a part of a ceiling of the plasma processing chamber 10. A plasma processing space 10*s* defined by the shower head 13, a sidewall 10*a* of the plasma processing chamber 10, and the substrate support 11 is formed inside the plasma processing chamber 10. The plasma processing chamber 10 has at least one gas supply port for supplying at least one processing gas into the plasma processing space 10*s*, and at least one gas exhaust port for exhausting the gas from the plasma processing space 10*s*. The sidewall 10*a* is grounded. The shower head 13 and the substrate support 11 are electrically insulated from the plasma processing chamber 10.

The substrate support 11 includes a main body member 111 and a ring assembly 112. An upper surface of the main body member 111 has a central region 111*a* (substrate support surface) for supporting a substrate (wafer) W, and an annular region 111*b* (ring support surface) for supporting the ring assembly 112. The annular region 111*b* surrounds the central region 111*a* in a plan view. The ring assembly 112 includes one or a plurality of annular members, and at least one of the one or the plurality of annular members is an edge ring.

Figure 2:
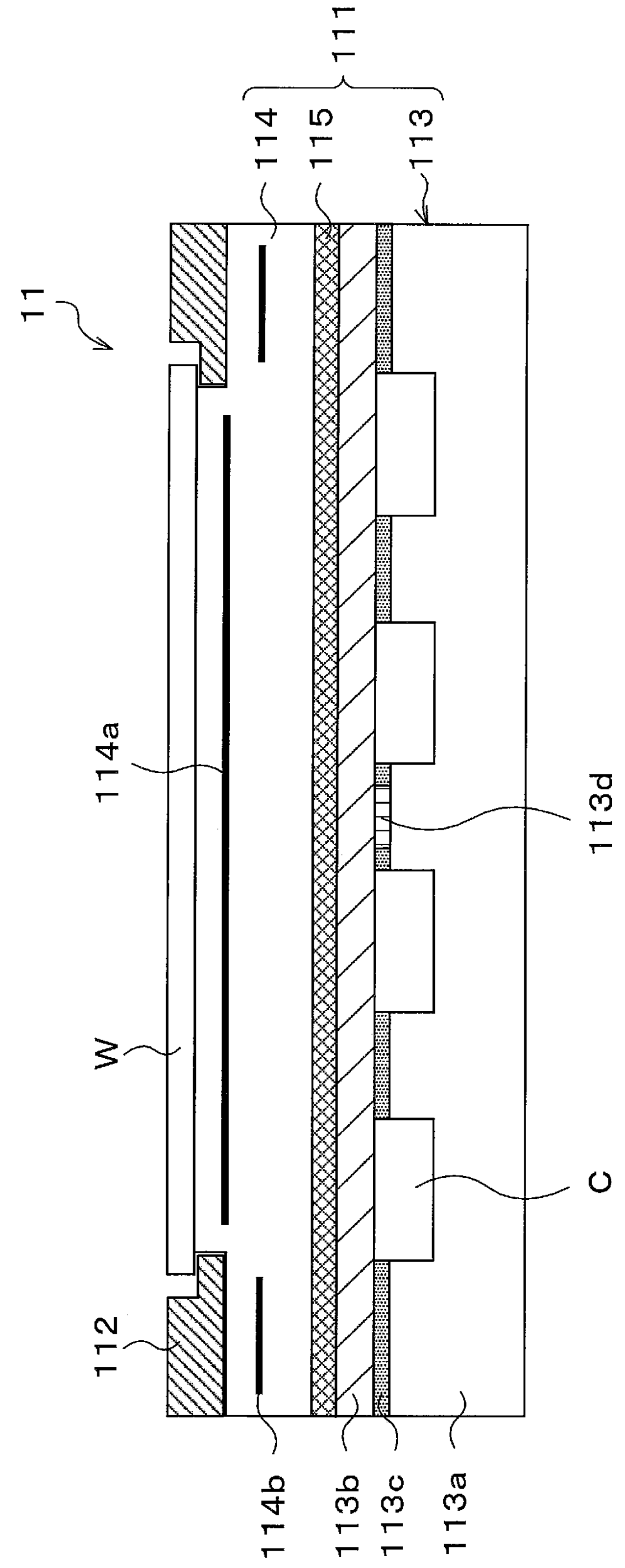
FIG. 2 is a vertical sectional view illustrating a configuration example of a substrate support according to a first embodiment.

As illustrated in FIG. 2, in one embodiment, the main body member 111 includes a base 113 and an electrostatic chuck 114. The base 113 and the electrostatic chuck 114 are laminated and bonded to each other via a metal bonding layer 115.

In one embodiment, the base 113 includes a main body member 113*a* and a heat transfer member 113*b*. The main body member 113*a* and the heat transfer member 113*b* are laminated and bonded to each other via an adhesive member 113*c*.

The main body member 113*a* is made of, for example, a conductive member such as an Al alloy. The conductive member of the main body member 113*a* functions as a lower electrode. A flow path C is formed on the upper surface of the main body member 113*a*, which is a surface of a side on which the heat transfer member 113*b* is bonded. In other words, the main body member 113*a* has an uneven shape in which the flow path C is formed in a sectional view. A heat transfer medium (fluid for temperature control) from a chiller unit (not illustrated) is circulated and supplied to the flow path C. Then, the heat transfer medium is circulated through the flow path C to adjust the temperature of the ring assembly 112, the electrostatic chuck 114 to be described later, and the substrate W to a desired temperature. As the heat transfer medium, by way of example, a coolant such as cooling water can be used.

Although FIG. 2 illustrates, as an example, a case where the flow path C is formed at the bottom of the central region 111*a* (substrate W) of the main body member 113*a*, the flow path C may be further formed at the bottom of the annular region 111*b* corresponding to the ring assembly 112.

The heat transfer member 113*b* is made of, for example, a conductive member such as an Al—Si composite material or an Al—SiC composite material (hereinafter, these may be collectively referred to as an "Al-based composite material"), more specifically, a conductive member having the same degree of linear expansion coefficient as that of the electrostatic chuck 114 which is described later. The heat transfer member 113*b* is formed in, for example, a disk shape having substantially the same diameter as that of the main body member 113*a*, and is bonded to the upper surface of the main body member 113*a* so as to close the flow path C formed in the main body member 113*a* from the upper surface. In other words, the heat transfer member 113*b* may function as a ceiling surface of the flow path C formed in the main body member 113*a*.

The adhesive member 113*c* bonds the main body member 113*a* and the heat transfer member 113*b*. The material of the adhesive member 113*c* is not particularly limited. However, for example, as in the above-described resin adhesive, an adhesive with high thermal resistance may be used.

In one embodiment, the base 113 is provided with a contact band 113*d* made of metal that electrically connects the main body member 113*a* and the heat transfer member 113*b*. The contact band 113*d* may be made of, for example, at least one of a composite material of Ti and Al, stainless steel, or BeCu.

The electrostatic chuck 114 is bonded to the upper surface of the base 113 (more specifically, the heat transfer member 113*b*) via the metal bonding layer 115 which is described later. The upper surface of the electrostatic chuck 114 has the central region 111*a* and the annular region 111*b* described above. A first electrode 114*a* for adsorbing and holding the substrate W and a second electrode 114*b* for adsorbing and holding the ring assembly 112 are provided inside the electrostatic chuck 114. The electrostatic chuck 114 is formed, for example, by interposing the first electrode 114*a* and the second electrode 114*b* between a pair of dielectric films made of a dielectric such as ceramic.

FIG. 2 is a view illustrating, as an example, a case where the central region 111*a* for holding the substrate W on the upper surface of the electrostatic chuck 114 and the annular region 111*b* for holding the ring assembly 112 on the upper surface thereof are integrated with each other. However, the configuration of the electrostatic chuck 114 is not limited thereto, and the central region 111*a* and the annular region 111*b* of the electrostatic chuck 114 may be independently formed. In this way, in the case where the central region 111*a* and the annular region 111*b* are formed independently of each other, the temperature adjustment of the substrate W and the temperature adjustment of the ring assembly 112 can be performed separately and independently from each other in a thermal manner.

The metal bonding layer 115 bonds the heat transfer member 113*b* of the base 113 and the electrostatic chuck 114. As the metal bonding layer 115, a material with low thermal resistance (high thermal conductivity), for example, a brazing metal such as an Al brazing material or an Ag brazing material, may be selected so that heat transfer between the heat transfer member 113*b* and the electrostatic chuck 114 is appropriately performed.

Although not illustrated, the substrate support 11 may be further provided with a heating module such as a heater that heats at least one of the ring assembly 112, the electrostatic chuck 114, and the substrate W. For example, the heater serving as the heating module may be provided at the bottom of the first electrode 114*a* and/or the second electrode 114*b* inside the electrostatic chuck 114. Further, the substrate support 11 may include a heat transfer gas supply configured to supply a heat transfer gas (backside gas) between a rear surface of the substrate W and an upper surface of the electrostatic chuck 114.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied from the gas supply 20 to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power), such as the source RF signal and the bias RF signal, to the conductive member (lower electrode) of the substrate support 11 and/or the conductive member (upper electrode) of the shower head 13. As a result, plasma is formed from at least one processing gas supplied into the plasma processing space 10*s*. Accordingly, the RF power source 31 may function as at least a portion of a plasma generator configured to generate plasma from one or more processing gases in the plasma processing chamber 10. Further, by supplying the bias RF signal to the lower electrode, a bias potential can be generated in the substrate W to draw an ionic component in the formed plasma to the substrate W.

In one embodiment, the RF power source 31 includes a first RF generator 31*a* and a second RF generator 31*b*. The first RF generator 31*a* is configured to be coupled to the lower electrode and/or the upper electrode via at least one impedance matching circuit to generate a source RF signal (source RF power) for plasma generation. In one embodiment, the source RF signal has a frequency in the range of 13 MHz to 150 MHz. In one embodiment, the first RF generator 31*a* may be configured to generate a plurality of source RF signals having different frequencies. The one or the plurality of source RF signals generated are supplied to the lower electrode and/or the upper electrode. The second RF generator 31*b* is configured to be coupled to the lower electrode via at least one impedance matching circuit to generate the bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31*b* may be configured to generate a plurality of bias RF signals having different frequencies. The one or the plurality of bias RF signals generated are supplied to the lower electrode. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is configured to be connected to the lower electrode and to generate the first DC signal. The generated first bias DC signal is applied to the lower electrode. In one embodiment, the first DC signal may be applied to another electrode, such as an adsorption electrode inside the electrostatic chuck 114. In one embodiment, the second DC generator 32*b* is configured to be connected to the upper electrode to generate a second DC signal. The generated second DC signal is applied to the upper electrode. In various embodiments, at least one of the first and second DC signals may be pulsed. The first and second DC generators 32*a* and 32*b* may be provided in addition to the RF power source 31, or the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure inside the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. For example, the computer 2*a* may include a processor (central processing unit (CPU)) 2*a*1, a storage 2*a*2, and a communication interface 2*a*3. The processor 2*a*1 may be configured to perform various control operations based on a program stored in the storage 2*a*2. The storage 2*a*2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

While various exemplary embodiments have been described above, various additions, omissions, substitutions and changes may be made without being limited to the exemplary embodiments described above. Indeed, elements from different embodiments may be combined to form another embodiment.

<Processing Method of Substrate by Plasma Processing Apparatus>

Next, an example of the processing method of the substrate W in the plasma processing apparatus 1 configured as described above will be described. In the plasma processing apparatus 1, the substrate W is subjected to an etching process (for example, HARC process).

First, the substrate W is carried into the plasma processing chamber 10, and the substrate W is placed on the electrostatic chuck 114 of the substrate support 11. Next, a voltage is applied to the adsorption electrode of the electrostatic chuck 114, and thus the substrate W is adsorbed and held by the electrostatic force onto the electrostatic chuck 114.

When the substrate W is adsorbed and held onto the electrostatic chuck 114, the inside of the plasma processing chamber 10 is then decompressed to a predetermined vacuum level. Further, the processing gas is supplied from the gas supply 20 to the plasma processing space 10s via the shower head 13. Further, the source RF power for plasma generation is supplied from the first RF generator 31a to the lower electrode, and thus the processing gas is excited to generate plasma. In this case, the bias RF power may be supplied from the second RF generator 31b. Then, in the plasma processing space 10s, the substrate W is subjected to an etching process by the action of the generated plasma.

When the etching process is ended, the supply of the source RF power from the first RF generator 31a and the supply of the processing gas from the gas supply 20 are stopped. In a case where the bias RF power is supplied during the etching process, the supply of the bias RF power is also stopped.

Next, the adsorption and holding of the substrate W by the electrostatic chuck 114 are stopped, and the charge neutralization of the substrate W and the electrostatic chuck 114 after the etching process is performed. Thereafter, the substrate W is detached from the electrostatic chuck 114, and the substrate W is carried out of the plasma processing apparatus 1. In this way, a series of etching processes is ended.

<Method for Cooling Substrate Supported on Substrate Support>

Figure 3:
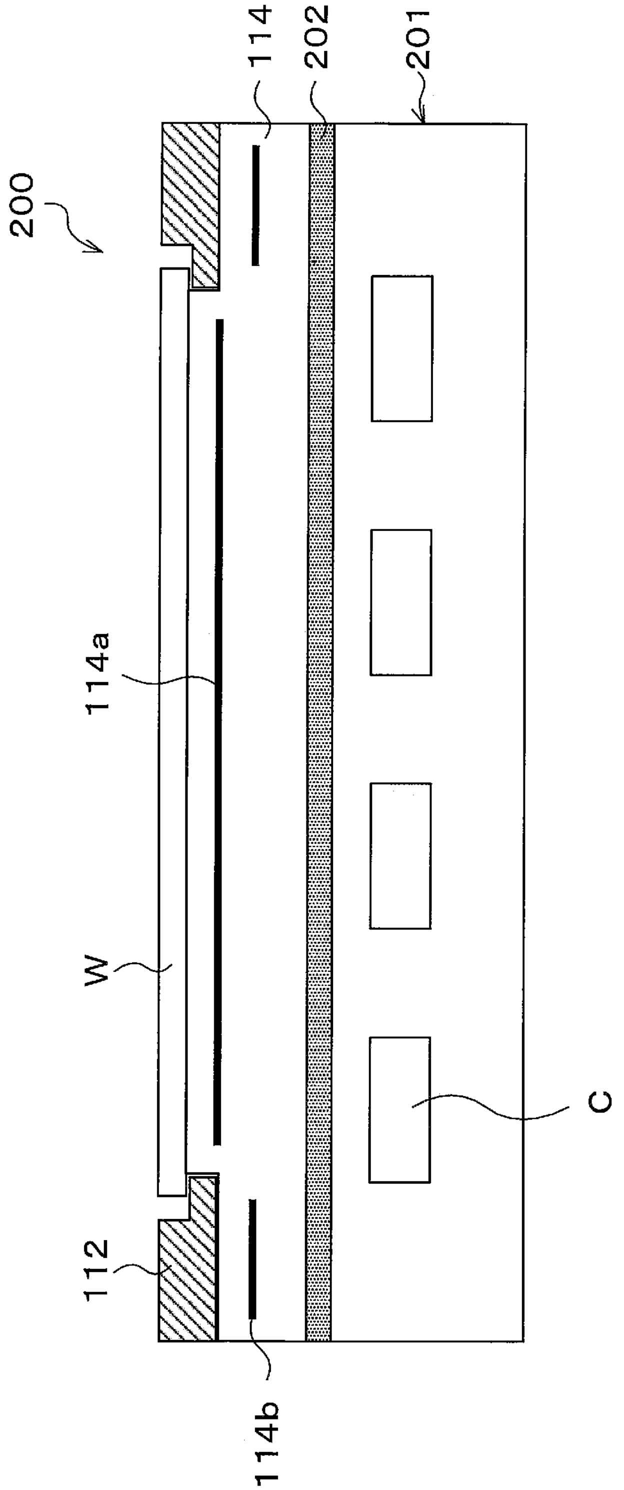
FIG. 3 is a vertical sectional view illustrating a configuration example of a conventional substrate support.

FIG. 3 is a vertical sectional view illustrating an example of a configuration of a conventional substrate support 200 provided in, for example, a substrate processing apparatus disclosed in Patent Document 1. In the following description, elements having the same configurations as those of the substrate support 11 according to the technique of the present disclosure will be denoted by the same reference numerals, and a detailed description thereof will be omitted.

As illustrated in FIG. 3, the conventional substrate support 200 includes an electrostatic chuck 114 and a base 201. The electrostatic chuck 114 and the base 201 are laminated and bonded to each other via an adhesive 202.

The electrostatic chuck 114 has the same configuration as the electrostatic chuck 114 used for the substrate support 11 of an embodiment of the present disclosure illustrated in FIG. 2. That is, for example, the first electrode 114a and the second electrode 114b are configured to be interposed between insulators made of an insulating material such as ceramic. Further, the substrate W and the ring assembly 112 are adsorbed and held on the upper surface of the electrostatic chuck 114.

The base 201 is made of, for example, a conductive member such as an Al alloy. The conductive member of the base 201 functions as a lower electrode. A flow path C is formed inside the base 201.

The adhesive 202 bonds the electrostatic chuck 114 and the base 201. As described above, as the adhesive 202, a resin adhesive with high thermal resistance (low thermal conductivity) is generally used.

Here, in a case where the substrate W is supported by the conventional substrate support 200 configured as described above and the HARC process as the etching process is performed, there is a concern that the hole cannot be formed appropriately in the substrate W by deep etching. Specifically, as described above, when RF is applied to the lower electrode at a high power, the temperature of the substrate W adsorbed and held by the electrostatic chuck 114 becomes high accordingly; thus, there is a concern that the formed hole is closed, so that the etching does not proceed.

As a method for suppressing the closing of the hole, cooling the substrate W held by the electrostatic chuck 114 by heat transfer from the coolant flowing through the flow path C formed in the base 201 is considered. However, like the conventional substrate support 200, in a case where the base 201 in which the flow path C is formed and the electrostatic chuck 114 that adsorbs and holds the substrate W are bonded to each other by the adhesive 202 that is the resin adhesive with high thermal resistance (thermal conductivity: 0.2 to 0.3 W/mK), there is a concern that the heat transfer from the coolant to the substrate W is hindered by the resin adhesive, so that the substrate W cannot be appropriately cooled.

Therefore, in the substrate support 11 of an embodiment of the present disclosure, as illustrated in FIG. 2, the base 113 in which the flow path C is formed is bonded to the electrostatic chuck 114 by a brazing metal (thermal conductivity: 100 to 160 W/mK) such as a metal bonding layer 115 with low thermal resistance, for example, the Al brazing material or the Ag brazing material. Further, in the substrate support 11 of an embodiment of the present disclosure, the base 113 in which the flow path C is formed is configured to be divided into: the main body member 113a forming at least a part of the bottom surface and the side surface of the flow path C, and comprising the conductive member; and the heat transfer member 113b forming the ceiling surface of the flow path C and comprising the conductive member having the same degree of the linear expansion coefficient as that of the electrostatic chuck 114. The main body member 113a and the heat transfer member 113b are adhered to each other by, by way of example, the resin adhesive with low thermal resistance.

In the case where the base 113 and the electrostatic chuck 114 are bonded to each other by the brazing metal (metal bonding layer 115) as in an embodiment of the present disclosure, the base 113 and the electrostatic chuck 114 are to be heated by the molten brazing metal. In this case, when a linear expansion coefficient difference between the base 113 and the electrostatic chuck 114 is large, the base 113 or the electrostatic chuck 114 may be damaged by a residual stress caused by a thermal stress generated during the bonding.

For example, as in the conventional substrate support 200 illustrated in FIG. 3, in a case where the base 201 made of an aluminum alloy (linear expansion coefficient: about 23e-6/° C.) and the electrostatic chuck 114 made of ceramic (linear expansion coefficient: about 7 to 8e-6/° C.) are bonded together by the brazing metal, the amount of linear expansion of the base 201 is larger than that of the electrostatic chuck 114. Therefore, when the metal bonding layer (brazing metal) cannot sufficiently alleviate the residual stress, the electrostatic chuck 114 may be damaged.

Therefore, in an embodiment of the present disclosure, as described above, at least the heat transfer member 113*b* of the base 113 that is directly bonded to the electrostatic chuck 114 is formed of the conductive member having the same degree of linear expansion coefficient as that of the electrostatic chuck 114 (ceramics), for example, an Al-based composite material (linear expansion coefficient: about 7 to 9e-6/° C.). In this way, in the case where the linear expansion coefficient difference between the electrostatic chuck 114 and the heat transfer member 113*b* bonded to each other via the metal bonding layer 115 is reduced, it is possible to reduce the thermal stress generated when the electrostatic chuck 114 and the base 113 are bonded to each other. In other words, it is possible to reduce the residual stress to be generated between the electrostatic chuck 114 and the heat transfer member 113*b*, and thus it is possible to appropriately suppress the damage to the base 113 and the electrostatic chuck 114 due to the linear expansion coefficient difference.

According to an embodiment of the present disclosure, as described above, the base 113 is configured to be divided into the main body member 113*a* and the heat transfer member 113*b*, and the linear expansion coefficient difference between the heat transfer member 113*b* that is directly bonded to the electrostatic chuck 114 and the electrostatic chuck 114 to be bonded are reduced. Thus, the base 113 and the electrostatic chuck 114 are appropriately bonded to each other by using the brazing metal, so that the substrate support 11 according to an embodiment of the present disclosure can be formed.

Further, according to an embodiment of the present disclosure, as described above, in a manner of bonding the base 113 and the electrostatic chuck 114 with the brazing metal (metal bonding layer 115), heat transfer from the coolant flowing through the flow path C to the electrostatic chuck 114 (substrate W) is promoted as compared with the conventional technique, and the substrate W can be appropriately cooled via the metal bonding layer 115. In other words, it is possible to achieve both high power of the RF applied to the lower electrode and low temperature of the substrate W.

Further, in this case, the heat transfer member 113*b* is in direct contact with the coolant by serving as the ceiling surface of the flow path C, and also bonded to the main body member 113*a* having a large heat capacity by the resin adhesive with low thermal resistance. As a result, heat transfer from the coolant to the heat transfer member 113*b* is directly performed, while heat transfer from the heat transfer member 113*b* to the main body member 113*a* is suppressed. Therefore, heat transfer from the coolant to the electrostatic chuck 114 (substrate W) can be more appropriately performed.

The conductive member comprised in the heat transfer member 113*b* is not limited to the Al-based composite material as described in the embodiments of the present disclosure, and, thus, any material may be selected as long as it is a conductive member having a small linear expansion coefficient difference with that of the electrostatic chuck 114 (ceramics). Specifically, the present inventors have intensively investigated that in a case where the heat transfer member 113*b* is made of a conductive member having a linear expansion coefficient difference of 3e-6/° C. or less with respect to the electrostatic chuck 114 (ceramics), the damage due to the linear expansion coefficient difference can be appropriately suppressed.

Other examples of the conductive member whose linear expansion coefficient difference with ceramics is 3e-6/° C. or less may include a Ti alloy (linear expansion coefficient difference: 2e-6/° C.) or the like.

Here, as described above, even in the case where the heat transfer member 113*b* is formed of the conductive member having a small linear expansion coefficient difference between the heat transfer member 113*b* and the electrostatic chuck 114, when the brazing metal having a high bonding temperature between the heat transfer member 113*b* and the electrostatic chuck 114 is selected and bonded, the electrostatic chuck 114 may be damaged by the thermal stress to be generated during the bonding. Specifically, even in a case where the linear expansion coefficient difference between the heat transfer member 113*b* and the electrostatic chuck 114 is small, when the bonding temperature is high, a difference in the amount of expansion and contraction deformation during the bonding becomes large, so that the damage of the electrostatic chuck 114 may be caused.

Therefore, in an embodiment of the present disclosure, in order to suppress the damage to the electrostatic chuck 114 due to the thermal stress generated during the bonding, it is desirable to select a brazing metal having a bonding temperature of, for example, 700° C. or lower as the brazing metal employed for the metal bonding layer 115. In this way, in the case where the brazing metal is selected whose bonding temperature is equal to or lower than the desired temperature, the difference in the amount of expansion and contraction deformation generated during the bonding can be reduced, that is, the base 113 (heat transfer member 113*b*) and the electrostatic chuck 114 can be appropriately bonded to each other while the electrostatic chuck 114 can be suppressed from being damaged.

FIG. 4 is a table illustrating a relationship between the base 113 and the electrostatic chuck 114 as described above, specifically, the correspondence between the linear expansion coefficient difference and the bonding temperature of the brazing metal.

As described above, in the substrate support 11 of an embodiment of the present disclosure, it is preferable that the base 113 in which the flow path C is formed is formed of a conductive member having a linear expansion coefficient difference of 3e-6/° C. or less with respect to the electrostatic chuck 114, and that the base 113 is bonded to the electrostatic chuck 114 by a brazing metal having a high thermal conductivity and a bonding temperature of 700° C. or lower.

In this case, for example, as illustrated in FIG. 4, it is desirable that at least the heat transfer member 113*b* of the base 113 is formed of an Al-based composite material (linear expansion coefficient difference: 1e-6/° C.), and that the Al brazing material or the Ag brazing material (bonding temperature: 500° C. to 700° C.) is used as the metal bonding layer 115.

<Operations and Effects of Substrate Support According to Present Disclosure>

As described above, according to the substrate support 11 of an embodiment of the present disclosure, the base 113 in which the flow path C is formed and the electrostatic chuck 114 that adsorbs and holds the substrate W are bonded to each other by the metal bonding layer 115 with low thermal resistance.

In this case, when the upper surface side (heat transfer member 113*b* in the embodiment) of the base 113 bonded to the electrostatic chuck 114 is made of a conductive member having a small linear expansion coefficient difference with the electrostatic chuck 114, preferably, 3e-6/° C. or less, damage to the base 113 and the electrostatic chuck 114 due to thermal stress during metal bonding can be appropriately suppressed.

Then, as described above, by the metal bonding between the base 113 and the electrostatic chuck 114, that is, the bonding with the metal bonding layer 115 with low thermal resistance, the heat transfer from the coolant to the substrate W can be appropriately performed, so that cooling of the substrate W can be appropriately performed.

Further, in this case, since the heat transfer member 113*b* directly bonded to the electrostatic chuck 114 serves as the ceiling surface of the flow path C, and the heat transfer member 113*b* and the main body member 113*a* are bonded to each other by the resin adhesive with high thermal resistance, the heat transfer from the coolant to the substrate W can be more appropriately performed.

Further, as described above, in an embodiment of the present disclosure, since the heat transfer between the coolant and the substrate W can be appropriately performed, for example, even in a case where the HARC process is performed as the etching process, the substrate W can be appropriately cooled. In other words, in the substrate support 11 according to an embodiment of the present disclosure, it is possible to achieve both high power of RF and low temperature of the substrate W, and it is possible to form appropriately the hole in the substrate W by deep etching.

Further, even in a case where the RF is applied thereto at a high power during the HARC process, and the heat transfer member 113*b* and the electrostatic chuck 114 are therefore subjected to a high temperature, the difference in the amount of expansion and contraction deformation between the heat transfer member 113*b* and the electrostatic chuck 114, that is, the residual stress to be generated, can be reduced. Then, since the residual stress to be thus generated becomes small, the damage occurring due to the linear expansion coefficient difference between the base 113 and the electrostatic chuck 114 during the HARC process may be appropriately suppressed. In other words, the damage to the base 113 and the electrostatic chuck 114 can be suppressed not only during the metal bonding but also during the HARC process.

Further, according to an embodiment of the present disclosure, as the metal bonding layer 115 that bonds the base 113 and the electrostatic chuck 114, the brazing metal (for example, the Al brazing material or the Ag brazing material) having a bonding temperature of 700° C. or lower is selected.

In this way, it is possible to reduce the thermal stress generated when the base 113 and the electrostatic chuck 114 are bonded to each other. In other words, it is possible to appropriately suppress the occurrence of the damage to the electrostatic chuck 114 due to the thermal stress, so that bond the base 113 and the electrostatic chuck 114 can be appropriately bonded.

Further, according to the substrate support 11 of an embodiment of the present disclosure, as described above, since the base 113 and the electrostatic chuck 114 are mutually bonded through the metal bonding layer 115, the thermal responsiveness of the substrate support 11 and the substrate W during the etching process is improved. That is, for example, since a thermal following property can be improved during a hybrid operation in which the RF is alternately applied at the high power and the low power in the etching process, it is possible to repeat such a switching between the powers of the RF in a shorter time.

In the embodiment described above, the base 113 is formed by bonding the main body member 113*a* having an uneven shape and the heat transfer member 113*b* having a substantially flat plate shape in a sectional view. However, the configuration of the base 113 is not limited thereto.

Figure 5:
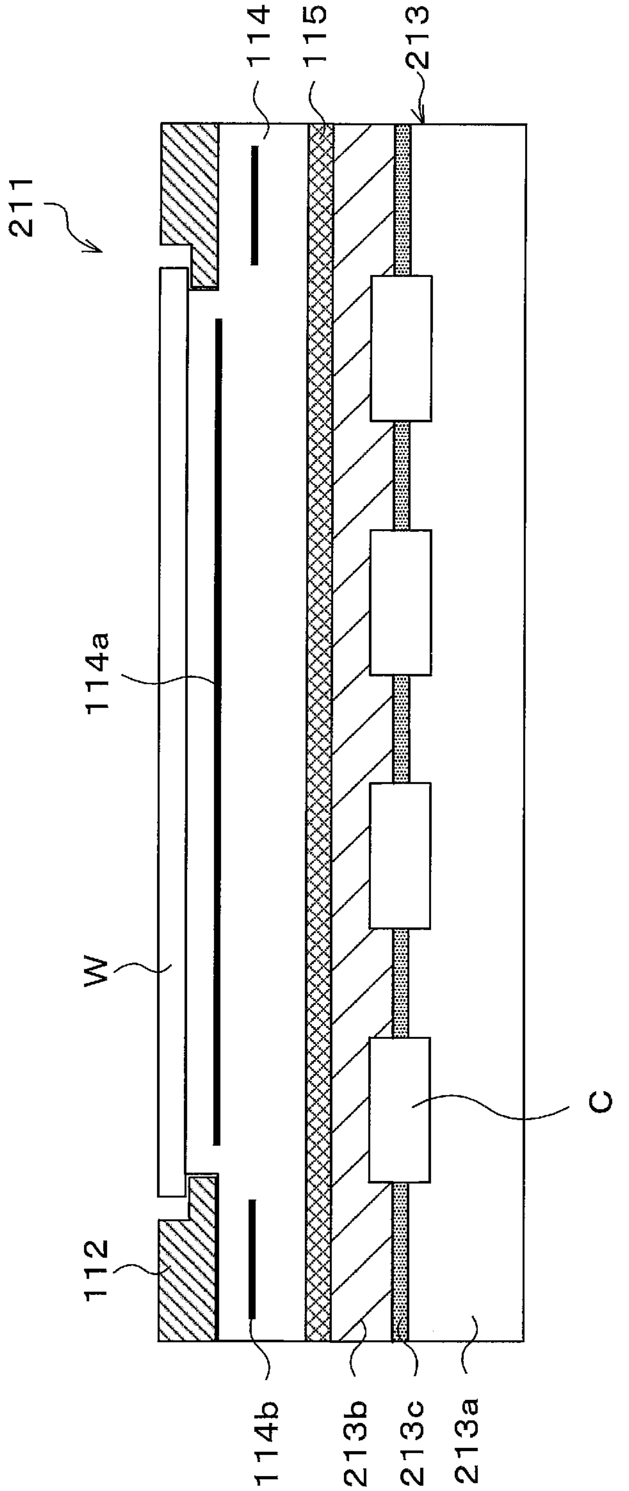
FIG. 5 is a vertical sectional view illustrating a configuration example of a substrate support according to a second embodiment.

FIG. 5 is a vertical sectional view illustrating a schematic configuration of a substrate support according to the second embodiment.

As illustrated in FIG. 5, in a substrate support 211 according to the second embodiment, a base 213 and an electrostatic chuck 114 are mutually bonded via a metal bonding layer 115. Further, in the base 213, for example, a main body member 213*a* having an uneven shape upward in a sectional view and a heat transfer member 213*b* having an uneven shape downward in a sectional view are mutually connected via an adhesive member 213*c*.

The main body member 213*a* is made of, for example, a conductive member such as an Al alloy and functions as the lower electrode. Further, as described above, the main body member 213*a* has the uneven shape upward in a sectional view. The uneven shape is disposed to face the uneven shape formed in the heat transfer member 213*b* to be described later, thereby forming the flow path C. In other words, the uneven shape formed in the main body member 213*a* defines at least a part of the side surfaces of the flow path C and the bottom surface of the flow path C.

The heat transfer member 213*b* is made of, for example, a conductive member (for example, an Al-based composite material) having the same degree of linear expansion coefficient as that of the electrostatic chuck 114. Further, as described above, the heat transfer member 213*b* has the uneven shape downward in a sectional view. The uneven shape is disposed to face the uneven shape formed in the main body member 213*a*, thereby forming the flow path C. In other words, the uneven shape formed in the heat transfer member 213*b* defines at least a part of the side surfaces of the flow path C and the ceiling surface of the flow path C.

The adhesive member 213*c* bonds the main body member 213*a* and the heat transfer member 213*b*. As the adhesive member 213*c*, for example, the resin adhesive with high thermal resistance can be used.

According to the substrate support 211 of the second embodiment, the heat transfer member 213*b* connected to the electrostatic chuck 114 via the metal bonding layer 115 is formed to have the uneven shape in a sectional view, so that a contact area between the heat transfer member 213*b* and the flow path C can be increased.

Accordingly, the amount of heat transfer from the coolant to the heat transfer member 213*b*, that is, the cooling capacity of the electrostatic chuck 114 (substrate W) by the heat transfer member 213*b* can be improved, so that cooling of the substrate W can be performed more appropriately.

Further, in an embodiment of the present disclosure, similar to the substrate support 11 according to the first embodiment, the main body member 213*a* and the heat transfer member 213*b* are bonded to each other by the resin adhesive with high thermal resistance. As a result, it is possible to suppress the heat transfer between the heat transfer member 213*b* and the main body member 213*a* having a large heat capacity, that is, the cooling of the substrate W can be performed more appropriately.

Figure 6:
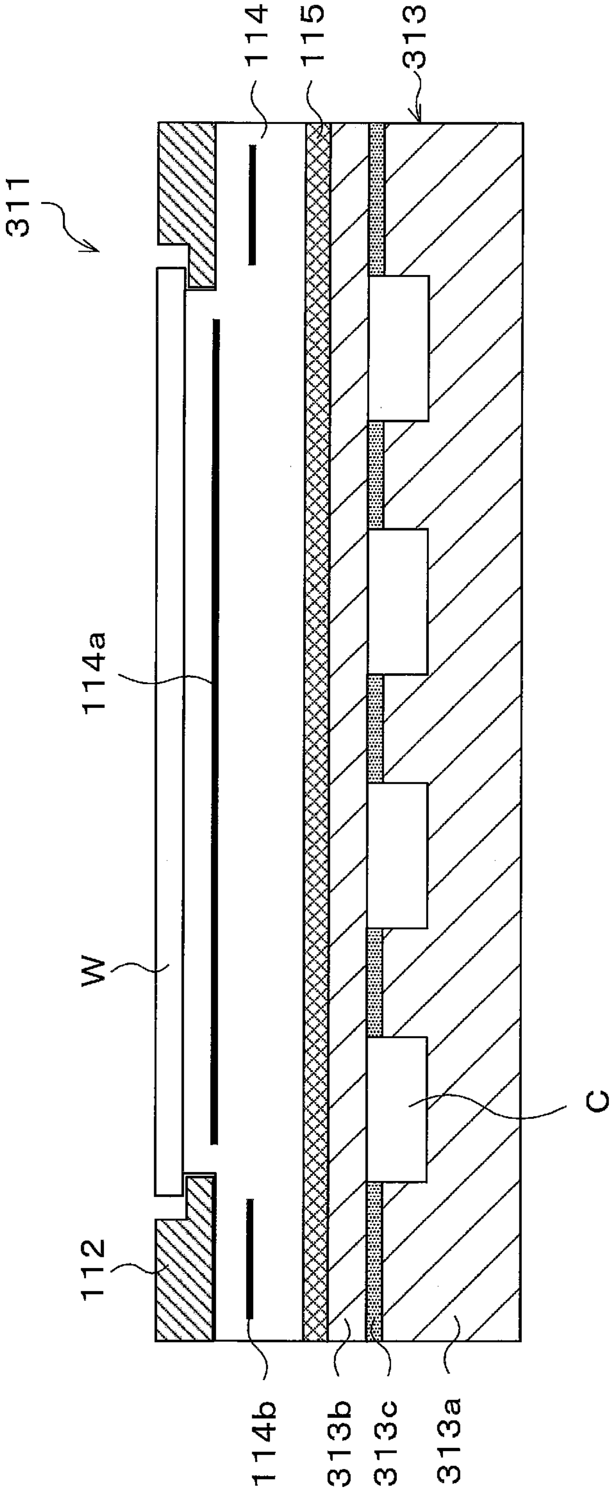
FIG. 6 is a vertical sectional view illustrating a configuration example of a substrate support according to a third embodiment.

Next, FIG. 6 is a vertical sectional view illustrating a schematic configuration of a substrate support according to a third embodiment.

As illustrated in FIG. 6, in a substrate support 311 according to the third embodiment, a base 313 and the electrostatic chuck 114 are mutually bonded via the metal bonding layer 115. Further, in the base 313, for example, a main body member 313*a* having an uneven shape upward in a sectional view and a heat transfer member 313*b* having a substantially disk shape are bonded to each other through an adhesive member 313*c*.

The main body member 313*a* is made of, for example, the conductive member (for example, an Al-based composite material) having the same degree of linear expansion coefficient as that of the electrostatic chuck 114, and serves as the lower electrode. Further, as described above, the main body member 313*a* has the uneven shape upward in a sectional view. The uneven shape is covered by the heat transfer member 313*b* which is described later to form the flow path C. In other words, the uneven shape formed in the main body member 313*a* defines the bottom surface of the flow path C and the side surface of the flow path C.

The heat transfer member 313*b* is made of, for example, the conductive member (for example, an Al-based composite material) having the same degree of linear expansion coefficient as that of the electrostatic chuck 114. The heat transfer member 313*b* is laminated and disposed with the main body member 313*a* to cover the uneven shape formed in the main body member 313*a*. In other words, the heat transfer member 313*b* defines the ceiling surface of the flow path C.

The adhesive member 313*c* bonds the main body member 313*a* and the heat transfer member 313*b*. As the adhesive member 313*c*, for example, a resin adhesive with high thermal resistance can be used.

According to the substrate support 311 of the third embodiment, the main body member 313*a* and the heat transfer member 313*b* forming the base 313 each are made of the same conductive material as described above.

In this way, for example, even in a case where the RF is applied thereto at a high power in the HARC process to subject the main body member 313*a* and the heat transfer member 313*b* to a high temperature, an occurrence of the difference in the amount of expansion and contraction deformation between the main body member 313*a* and the heat transfer member 313*b* is suppressed. That is, an occurrence of damage to the base 313 during the HARC process is suppressed, and the substrate W can be more stably adsorbed and held by the substrate support 311.

As described in the first to third embodiments, in the case where the heat transfer member bonded to at least the electrostatic chuck 114 via the metal bonding layer 115 is made of the conductive member having the same degree of linear expansion coefficient as that of the electrostatic chuck 114, damage to the substrate support by the residual stress caused by the linear expansion coefficient difference between the electrostatic chuck 114 and the heat transfer member can be suppressed.

Meanwhile, as described in the first to third embodiments, the main body member disposed below the heat transfer member may be made of any member, for example, the Al-based composite material having the same degree of linear expansion coefficient as that of the electrostatic chuck 114, the Al alloy conventionally used for the substrate support, or the like.

For example, in a case where the main body member is made of the Al-based composite material having the same degree of linear expansion coefficient as that of the electrostatic chuck 114, it is possible to suppress the damage to the base due to a high temperature in the HARC process.

Further, for example, the Al alloy or the like conventionally used for the substrate support is a member which is cheaper and easier to process than the Al-based composite material. That is, when the main body member is made of the Al alloy or the like, the flow path C can be easily formed with respect to the main body member, and the cost for forming the substrate support can be reduced.

As described in the first to third embodiments, the main body member and the heat transfer member that constitute the base are bonded to each other by, for example, the resin adhesive with high thermal resistance. However, the resin adhesive may have solubility with respect to the coolant, depending on the type of the coolant flowing through the flow path C. In this case, since the resin adhesive is provided adjacent to the flow path C as illustrated in FIGS. 2, 5, and 6, when the resin adhesive comes into contact with the coolant, the resin adhesive may be damaged when the coolant flows therethrough, so that the main body member and the heat transfer member may be separated.

Figure 7:
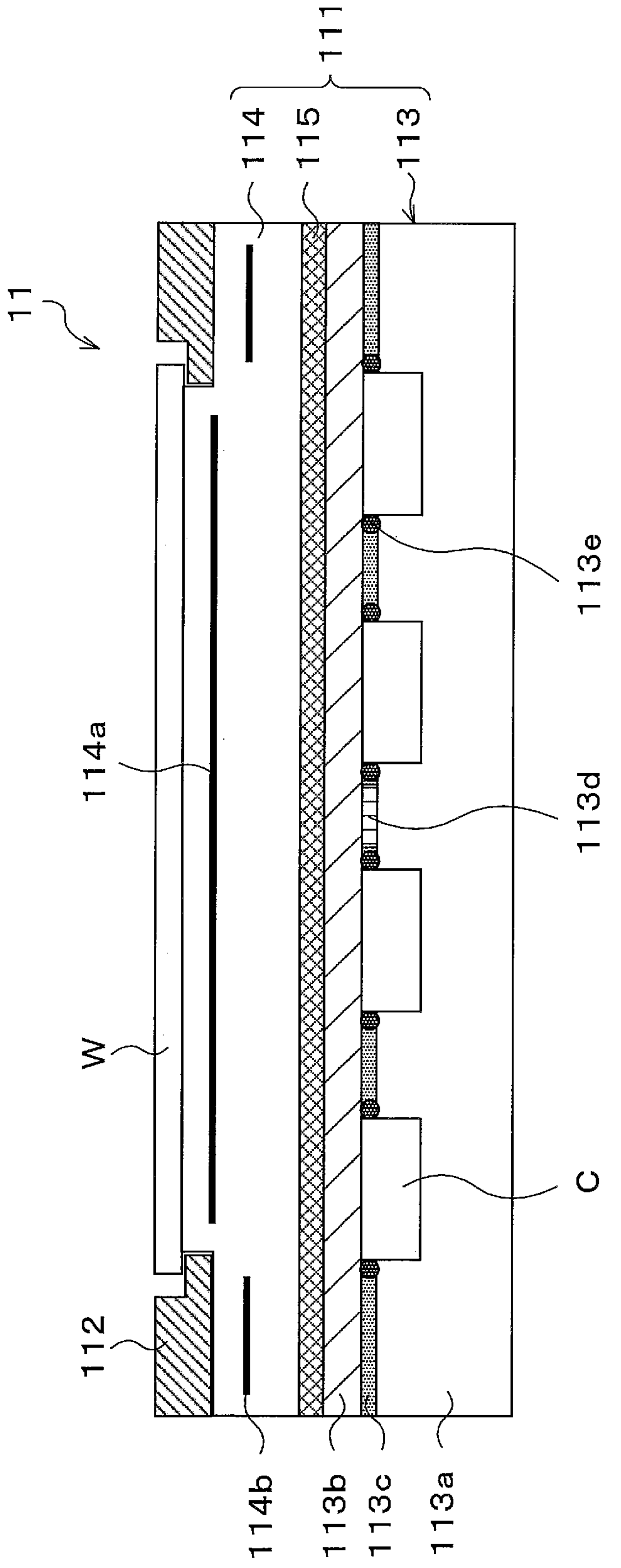
FIG. 7 is a vertical sectional view illustrating another configuration example of the substrate support.

Therefore, as described above, in order to suppress the damage of the resin adhesive by the coolant, for example, as illustrated in FIG. 7, a sealing member 113*e* (for example, an O-ring) for preventing the contact between the coolant and the adhesive member 113*c* may be provided on the contact surface between the adhesive member 113*c* (resin adhesive) and the flow path C.

In this way, by way of providing the sealing member 113*e* to prevent the contact between the coolant and the adhesive member 113*c*, damage to the adhesive member 113*c* can be appropriately suppressed.

Figure 8:
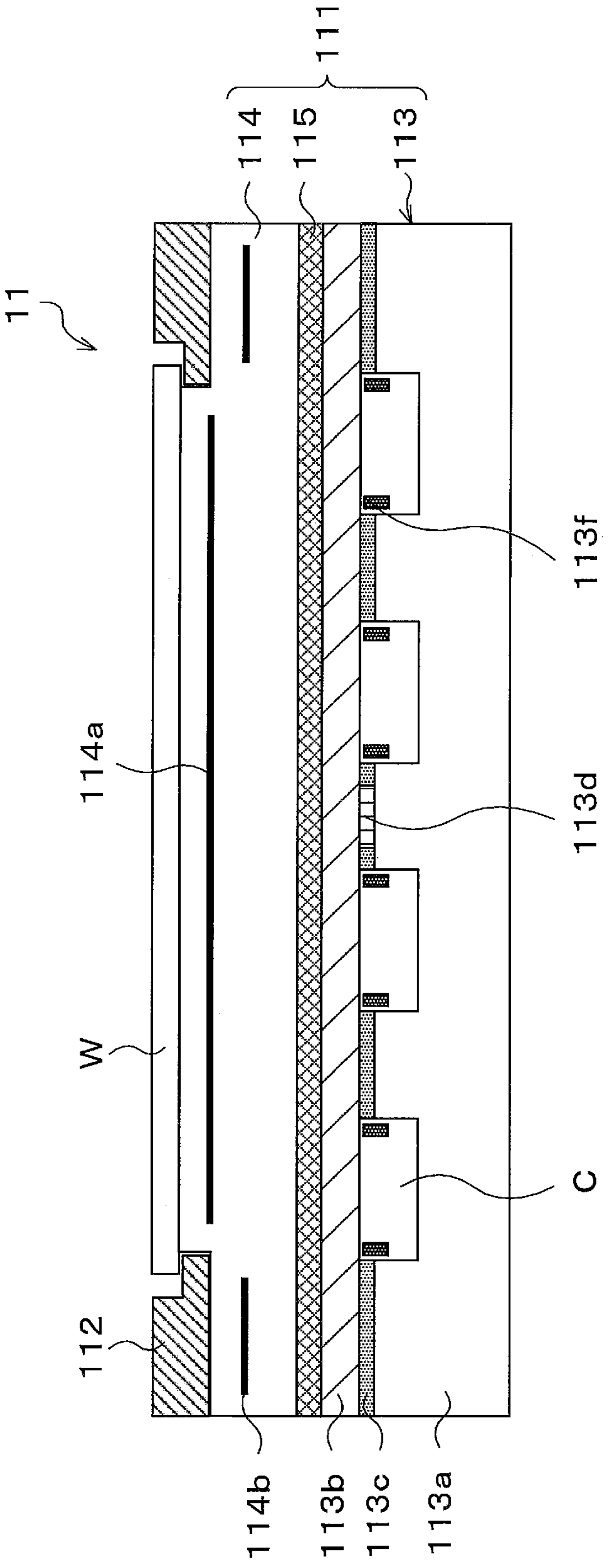
FIG. 8 is a vertical sectional view illustrating still another configuration example of the substrate support.

Further, for example, as illustrated in FIG. 8, in order to suppress the damage of the resin adhesive by the coolant, a weir 113*f* for lowering the flow velocity of the coolant that flows through the flow path C may be formed in the vicinity of the contact surface between the adhesive member 113*c* and the flow path C. The shape and disposition of the weir 113*f* are not particularly limited, and for example, the weir 113*f* is provided on an upstream side in the flow direction of the coolant in the flow path C with respect to the adhesive member 113*c*, so as to reduce the flow velocity of the coolant that comes into contact with the adhesive member 113*c*.

Accordingly, it is possible to reduce the amount of dissolving the adhesive member 113*c* with respect to the coolant per unit time/unit flow rate, that is, it is possible to suppress the damage of the adhesive member 113*c*.

Only one or both of the sealing member 113*e* illustrated in FIG. 7 and the weir 113*f* illustrated in FIG. 8 may be provided. Specifically, only the one of the sealing member 113*e* and the weir 113*f* may be provided in the flow path C formed in one substrate support as illustrated in FIGS. 7 and 8, or both of the sealing member 113*e* and the weir 113*f*, although not illustrated, may be provided therein.

In the above-described embodiment, a case where the base and the electrostatic chuck are bonded to each other via the metal bonding layer, which is the brazing metal such as the Al brazing material or the Ag brazing material, is described as an example. However, the bonding member between the base and the electrostatic chuck is not limited to such a brazing metal.

Specifically, the base and the electrostatic chuck may be bonded to each other using the bonding member having a higher thermal conductivity compared to the resin adhesive (thermal conductivity: 0.2 to 0.3 W/mK) used in bonding the base and the electrostatic chuck to each other in at least a conventional substrate support.

As a result, at least the amount of heat transfer from the coolant to the substrate W can be increased compared to the conventional substrate support, that is, at least the cooling of the substrate W can be appropriately performed.

It shall be understood that the embodiments disclosed herein are illustrative and are not restrictive in all aspects. The embodiment described above may be omitted, replaced, or modified in various forms without departing from the scope and spirit of the appended claims.

The invention claimed is:

1. A substrate support for supporting a substrate, comprising:

a conductive base having a flow path formed therein through which a fluid for temperature control of the substrate flows;

an electrostatic chuck disposed on an upper surface of the base and having a support surface of the substrate on an upper surface of the electrostatic chuck; and a metal bonding portion configured to mutually bond the base and the electrostatic chuck, wherein the base includes:

a main body member configured to define at least a part of a side surface of the flow path and a bottom surface of the flow path;

a heat transfer member configured to define a ceiling surface of the flow path and perform heat transfer between the fluid for temperature control and the electrostatic chuck;

an adhesive made of a resin material configured to mutually bond the main body member and the heat transfer member; and a contact band made of metal electrically connecting the main body member and the heat transfer member through the adhesive.

2. The substrate support according to claim 1, wherein the heat transfer member is made of a member whose linear expansion coefficient difference with the electrostatic chuck is 3e-6 or less.

3. The substrate support according to claim 2, wherein the heat transfer member is made of at least one selected from the group consisting of a composite material of Al and Si, a composite material of Al and SiC, and a Ti alloy.

4. The substrate support according to claim 1, wherein the main body member is made of the same member as the heat transfer member.

5. The substrate support according to claim 1, wherein the main body member is made of an Al alloy.

6. The substrate support according to claim 1, wherein the metal bonding portion is a brazing metal having a bonding temperature of 700° C. or lower.

7. The substrate support according to claim 6, wherein the brazing metal is at least either an Al brazing material or an Ag brazing material.

8. The substrate support according to claim 1, further comprising at least one weir configured to reduce a flow velocity of the fluid for temperature control flowing in the flow path.

9. The substrate support according to claim 1, further comprising:

a sealing member that blocks a space between the fluid for temperature control and the resin material.

10. A substrate processing apparatus comprising:

a processing chamber configured to define a processing space of the substrate;

the substrate support according to claim 1 which is disposed in the processing space;

a gas supply configured to supply a processing gas into the processing space; and a plasma generator configured to generate plasma in the processing space from the processing gas.

* * * * *